United States Patent
Sakio et al.

(10) Patent No.: US 10,501,841 B2
(45) Date of Patent: Dec. 10, 2019

(54) DEPOSITION MASK, METHOD FOR MANUFACTURING THE SAME, AND METHOD FOR MANUFACTURING ORGANIC EL DISPLAY APPARATUS

(71) Applicant: HON HAI PRECISION INDUSTRY CO., LTD., New Taipei (TW)

(72) Inventors: Susumu Sakio, Osaka (JP); Katsuhiko Kishimoto, Osaka (JP)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 0 days.

(21) Appl. No.: 16/078,881

(22) PCT Filed: Jul. 27, 2016

(86) PCT No.: PCT/JP2016/072068
§ 371 (c)(1),
(2) Date: Aug. 22, 2018

(87) PCT Pub. No.: WO2017/145402
PCT Pub. Date: Aug. 31, 2017

(65) Prior Publication Data
US 2019/0055640 A1    Feb. 21, 2019

(30) Foreign Application Priority Data
Feb. 23, 2016 (JP) .................. 2016-032183

(51) Int. Cl.
*H01L 51/40* (2006.01)
*B65D 5/00* (2006.01)
(Continued)

(52) U.S. Cl.
CPC ............ *C23C 14/042* (2013.01); *C23C 14/04* (2013.01); *C23C 16/042* (2013.01); *H01L 51/56* (2013.01);
(Continued)

(58) Field of Classification Search
CPC ....... H01L 51/56; C23C 14/04; C23C 14/042; C23C 16/042
(Continued)

(56) References Cited

U.S. PATENT DOCUMENTS

2003/0148078 A1  8/2003  Aida
2004/0232109 A1*  11/2004  Yoshinaga ............ C23C 14/042
                                                                216/54
2016/0168691 A1  6/2016  Takeda et al.

FOREIGN PATENT DOCUMENTS

CN    105143497 A    12/2015
JP    H03-274261 A    12/1991
(Continued)

*Primary Examiner* — David S Blum
(74) *Attorney, Agent, or Firm* — ScienBiziP, P.C.

(57) ABSTRACT

A deposition mask capable of performing high-definition patterning while suppressing position gap between a substrate for vapor deposition and an opening arrangement of the deposition mask during vapor deposition and a manufacturing method thereof are provided. A deposition mask (1) includes a resin film (2) having an opening (4) pattern for forming a thin layer pattern by vapor deposition on a substrate for vapor deposition. The deposition mask (1) includes a low-emissivity layer (5) whose emissivity is lower than that of the resin film (2), which is formed at least partly on a surface of the resin film (2) facing a vapor deposition source, thereby suppressing temperature rise of the resin film (2) due to heat radiated from the vapor deposition source.

13 Claims, 3 Drawing Sheets

(51) Int. Cl.
  *C03C 25/68* (2006.01)
  *C23C 14/04* (2006.01)
  *C23C 16/04* (2006.01)
  *H01L 51/56* (2006.01)
  *H01L 51/00* (2006.01)
  *H01L 27/32* (2006.01)

(52) U.S. Cl.
  CPC ....... *H01L 27/3211* (2013.01); *H01L 27/3246* (2013.01); *H01L 51/0011* (2013.01)

(58) Field of Classification Search
  USPC .............................. 438/99; 427/256; 216/54
  See application file for complete search history.

(56) References Cited

FOREIGN PATENT DOCUMENTS

| | | | |
|---|---|---|---|
| JP | 2001-277424 | A | 10/2001 |
| JP | 2004-323888 | A | 11/2004 |
| JP | 2006-233285 | A | 9/2006 |
| JP | 2015-092016 | A | 5/2015 |
| JP | 2015092016 | A * | 5/2015 |
| JP | 2015-140464 | U | 8/2015 |
| JP | 2015-148002 | A | 8/2015 |
| JP | 2015-165051 | A | 9/2015 |

* cited by examiner

DEPOSITION MASK, METHOD FOR MANUFACTURING THE SAME, AND METHOD FOR MANUFACTURING ORGANIC EL DISPLAY APPARATUS

TECHNICAL FIELD

The present invention relates to a deposition mask which is employable in depositing an organic layer of an organic EL display apparatus, a method for manufacturing the deposition mask, and a method for manufacturing an organic EL display apparatus. More specifically, the present invention relates to a deposition mask which can suppress temperature rise thereof during vapor deposition, a method for manufacturing the deposition mask, and a method for manufacturing an organic EL display apparatus using the deposition mask.

BACKGROUND ART

When an organic EL display apparatus is manufactured, for example, an organic layer is deposited at places corresponding to respective pixels on an apparatus substrate wherein switching elements such as TFTs are formed on a support substrate. Therefore, a deposition mask is placed on the apparatus substrate beforehand and thereafter an organic material is disposed on the substrate via the deposition mask, resulting that a required amount of organic layer can be deposited for only required pixels. A metal mask has been conventionally used as the deposition mask. However, in order to form much fine pattern of mask openings, a recent trend is that resin films are used as mask material instead of the metal masks.

On the other hand, the deposition mask causes an organic material sublimated from a vapor deposition source to adhere to a substrate for vapor deposition via its opening, a crucible of the vapor deposition source used for vapor deposition in this case is heated up to a high temperature to cause the organic material, being a vapor deposition material, to sublimate. Therefore, the temperature of the deposition mask is increased by heat radiated from the vapor deposition source, the deposition mask material expands thermally, and the deposition mask deforms. Such deformation of the deposition mask induces position gap of an opening pattern of the deposition mask, imparts an adverse influence on positional accuracy and opening size, and deteriorates display quality when an organic EL display apparatus is formed.

In order to prevent position gap caused by such thermal deformation, for example, in a conventional metal mask, it is disclosed that invar or the like, which has a smaller coefficient of thermal expansion and hardly expands when heated, is used as a mask material (Patent Document 1). In addition, it is disclosed that a thermal barrier material is provided between a deposition mask and a vapor deposition source to absorb heat radiated from a vapor deposition source and release heat to the outside, thereby suppressing the temperature rise of the deposition mask (Patent Document 2).

Furthermore, when a resin film is used as a mask material, the coefficient of thermal expansion of any film is relatively greater compared with invar and it is difficult to solve the problem by material selection. In addition, when the vapor deposition source moves during layer formation like a linear source, since the temperature distribution in the mask varies with the movement of the vapor deposition source and the opening position displaces correspondingly, the size of a vapor deposited layer becomes greater than the opening size of the deposition mask.

PRIOR ART DOCUMENT

Patent Document

Patent Document 1: JP 2004-323888 A
Patent Document 2: JP 2015-140464 A

SUMMARY OF THE INVENTION

Problem to be Solved by the Invention

As mentioned above, the metal mask using invar that hardly expands when heated can minimize the influence of thermal expansion. However, there is a problem that the metal mask has a limitation in forming a finer vapor deposition pattern and therefore cannot be used.

On the other hand, using the thermal barrier material as another member as discussed in Patent Document 2 raises a problem of requiring complicated manufacturing processes not only for alignment between the substrate for vapor deposition and the deposition mask but also for alignment relative to the thermal barrier material.

Accordingly, the present invention has been made to solve the above-mentioned problems and an object thereof is to provide a deposition mask including a resin film which can suppress the temperature rise during vapor deposition and a method for manufacturing the same.

Another object of the present invention is to provide a method for manufacturing an organic EL display apparatus, which is excellent in display quality, by using the deposition mask formed by the above-mentioned manufacturing method.

Means to Solve the Problem

The inventors of the present invention conducted diligent studies to obtain a deposition mask capable of suppressing temperature rise during vapor deposition. As a result, the inventors have found that by providing, on a surface of a resin film of the deposition mask facing a vapor deposition source, a layer whose emissivity is lower than that of the resin film, it is possible to block heat radiated from the vapor deposition source, namely reduce the heat entering from the vapor deposition source to the deposition mask, thereby easily suppressing the temperature rise of the deposition mask. In addition, the inventors have found that by providing, on a surface of the resin film of the deposition mask to be brought into contact with a substrate for vapor deposition, a layer whose emissivity is higher than that of the resin film, it is possible to dissipate heat of the deposition mask to the substrate for vapor deposition such as a glass substrate, thereby contributing to suppress the temperature rise of the deposition mask.

A deposition mask according to the present invention is a deposition mask including a resin film having an opening pattern for forming a thin layer pattern by vapor deposition on a substrate for vapor deposition, and is characterized by including a low-emissivity layer whose emissivity is lower than that of the resin film is formed on at least a part of a surface of the resin film facing a vapor deposition source.

A method for manufacturing a deposition mask according to the present invention is a method for manufacturing a deposition mask including a resin film having an opening pattern and usable in vapor depositing a vapor deposition material, and having a low-emissivity layer whose emissivity is lower than that of the resin film on at least a part of a surface the resin film on a side facing a vapor deposition source, and is characterized in that the low-emissivity layer is formed after stretching and fixing the resin film to a support frame.

A method for manufacturing an organic EL display apparatus according to the present invention is a method for manufacturing an organic EL display apparatus by depositing an organic layer on an apparatus substrate, and is characterized in that the deposition mask according to the present invention is positioned and overlapped on the apparatus substrate having at least a TFT and a first electrode formed on a support substrate, an organic deposition layer is formed by vapor depositing an organic material on the first electrode, and a second electrode is formed on the deposited layer.

Effects of the Invention

According to the deposition mask of the present invention, since heat radiated from the vapor deposition source can be reflected by the low-emissivity layer when an opening pattern of the resin film is formed, the temperature rise of the deposition mask itself can be suppressed. This prevents occurrence of any displacement of the opening position or any change of opening size when vapor depositing an organic material. As a result, a highly accurate vapor deposition layer can be formed.

Further, according to the method for manufacturing a deposition mask of the present invention, after stretching and fixing the resin film constituting the deposition mask to the support frame, the low-emissivity layer is formed on at least a part of the surface of the resin film on the side facing the vapor deposition source. Therefore, the deposition mask that is free from cracking and peeling of the low-emissivity layer and, as a result, capable of effectively suppressing size change occurring due to temperature rise when vapor depositing the organic material can be obtained.

Further, according to the method for manufacturing an organic EL display apparatus of the present invention, since the organic layer is laminated by using the deposition mask capable of suppressing thermal expansion during vapor deposition and preventing the occurrence of any displacement of the opening position or any change of opening size, it is possible to obtain the organic EL display apparatus capable of forming an organic layer of each pixel very precisely even for high precision pixel pattern and, as a result, very excellent in display quality.

EMBODIMENT FOR CARRYING OUT THE INVENTION

Figure 1:
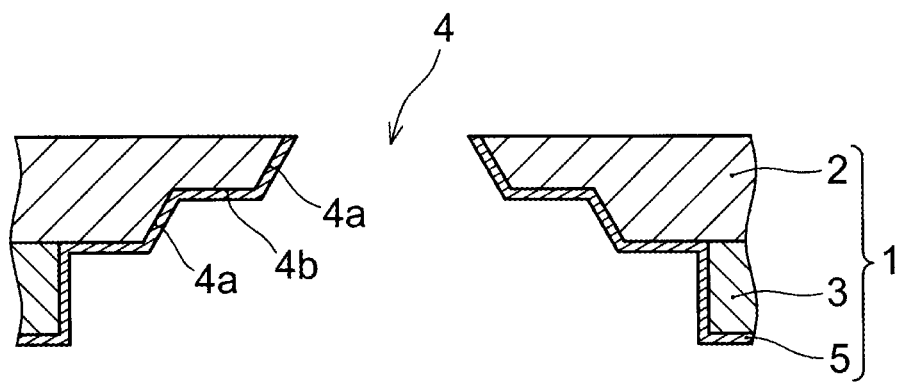
FIG. 1 is a view illustrating a cross section of an embodiment of a deposition mask according to the present invention.
Figure 2:
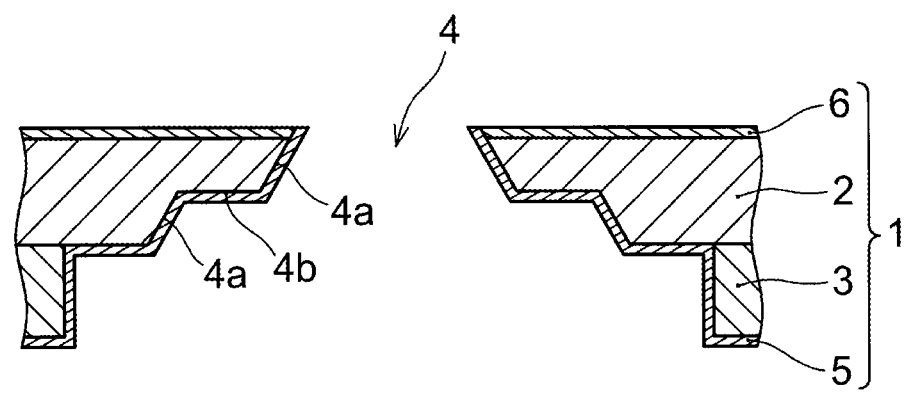
FIG. 2 is a view illustrating a cross section of another embodiment of a deposition mask according to the present invention.
Figure 3:
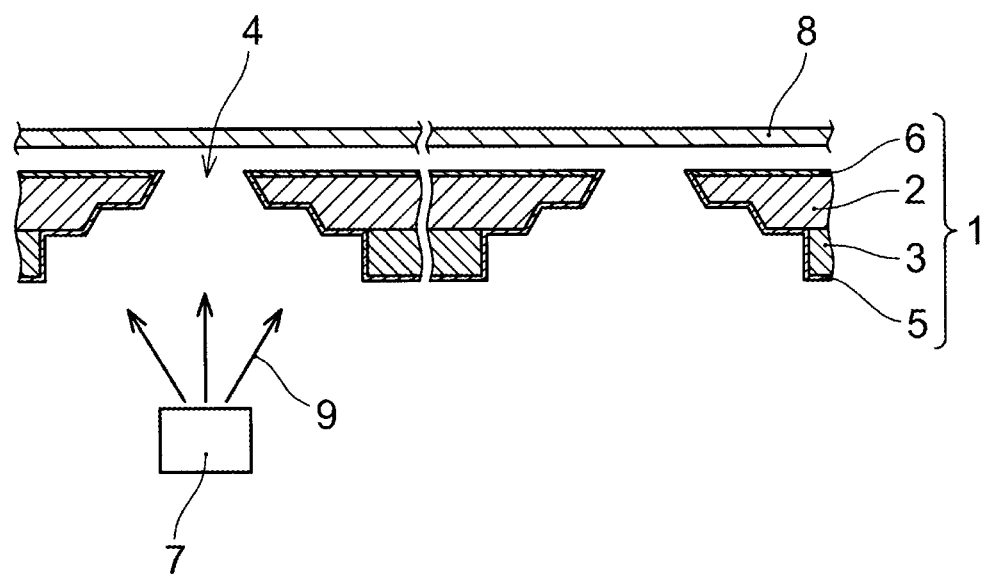
FIG. 3 is a view illustrating a positional relationship in a usage state of a deposition mask according to the present invention.

A deposition mask and a method for manufacturing the same according to the present invention will be described in detail below with reference to the attached drawings. As FIG. 1 an explanatory view of a partial cross section of an embodiment of the deposition mask according to the present invention is shown. As FIG. 2 an explanatory view of a partial cross section of another embodiment of the deposition mask according to the present invention is shown. As FIG. 3 a view illustrating a positional relationship in a usage state of the deposition mask according to the present invention is shown. FIGS. 1 and 2 illustrate only one opening and a surrounding region thereof, and FIG. 3 illustrates two openings and surrounding regions thereof. Actually, for example, a deposition mask having a large number of openings matching the number of pixel of at least one organic EL display apparatus (including the number of sub-pixel of RGB) is formed, and in some cases a plurality of them may be collectively formed.

A deposition mask 1 according to the present embodiment, as illustrated in FIG. 1, includes a low-emissivity layer 5 formed on at least a part of a surface of a resin film 2 on the side facing a vapor deposition source 7.

Further, as illustrated in FIGS. 2 and 3, the deposition mask of another embodiment can be configured to include a high-emissivity layer 6 formed on a surface of the resin film 2 to be brought into contact with a substrate for vapor deposition 8 in addition to the low-emissivity layer 5 formed on at least a part of the surface of the resin film 2 on the side facing the vapor deposition source 7.

As illustrated in FIGS. 1 to 3, in an embodiment of the present invention, a metal support layer 3 can be provided on a surface of the resin film 2 on the side facing the vapor deposition source 7. Although not illustrated in. FIGS. 1 to 3, in another embodiment, an adhesion layer can be provided between the resin film 2, and the low-emissivity layer 5 and/or the high-emissivity layer 6. Provision of the metal support layer 3 intends to prevent warpage or the like of the resin film 2 and enhance the strength of the resin film 2. On the other hand, the adhesion layer improves the adhesion between the resin film 2, and the low-emissivity layer 5 and/or the high-emissivity layer 6. In the case of providing the metal support layer 3, the low-emissivity layer 5 can be provided so as to cover a surface of the metal support layer 3 on the side facing the vapor deposition source 7. If the metal support layer 3 has an emissivity lower than that of the resin film 2, there will be no problem in forming the low-emissivity layer 5 only on the resin film 2. If the emissivity of the metal support layer 3 is lower than the emissivity of the low-emissivity layer 5, it is preferable that the low-emissivity layer 5 is not provided on the metal support layer 3.

Although not specifically limited, the resin film 2 preferably has a linear expansion coefficient that is not so different from that of the substrate for vapor deposition 8. For example, polyimide (PI) resin, polyethylene naphthalate (PEN) resin, polyethylene terephthalate (PET) resin, cycloolefin polymer (COP) resin, cyclic olefin copolymer (COC) resin, polycarbonate (PC) resin, polyamide resin, polyamide-imide resin, polyester resin, polyethylene resin, polyvinyl alcohol resin, polypropylene resin, polystyrene resin, polyacrylonitrile resin, ethylene-vinyl acetate copolymer resin, ethylene-vinyl alcohol copolymer resin, ethylene-methacrylic acid copolymer resin, polyvinyl chloride resin, polyvinylidene chloride resin, cellophane, ionomer resin are usable. Polyimide resin is preferable in adjustability of the linear expansion coefficient variable depending on conditions of a temperature ascent profile of the heat treatment in the case of forming a resin film by applying a precursor solution and performing heat treatment, but the resin film 2 is not limited thereto. The thickness of the resin film 2 is approximately several μm to several tens μm, for example, approximately 5 μm or more and 10 μm or less.

For example, appropriate metal material such as iron, stainless, invar, nickel or the like, whose thickness is approximately 5 μm or more and 30 μm or less, can be used as the metal support layer 3. Magnetic substance is preferable in that the magnetic force is available when fixing to the substrate for vapor deposition 8. However, when a support frame is made of a magnetic substance, the material of the metal support layer 3 is not particularly required to be a magnetic substance. Further, in consideration of less expansion when heated, using invar is more preferable.

The low-emissivity layer 5 is not limited specifically as long as it has a lower emissivity compared to the resin film 2. For example, in vapor depositing an organic material 9 to manufacture an organic EL display apparatus, the temperature of the deposition mask 1 in a vapor deposition apparatus is generally approximately in a range not lower than 22° C. and not higher than 60° C. According to Wien's displacement law, the peak wavelength of infrared ray in this temperature range is not less than 8,700 nm and not greater than 9,800 nm or less. Since the emissivity of the resin film 2 in the wavelength region not less than 8,700 nm and not greater than 9,800 nm is approximately 0.8 or more and approximately 0.95 or less, it is preferable that the emissivity of the low-emissivity layer 5 at the temperature not lower than 22° C. and not higher than 60° C. in the wavelength region not less than 8,700 nm and not greeter than 9,800 nm is preferably 0.3 or less, more preferably 0.1 or less, From this viewpoint, the low-emissivity layer 5 is preferably a layer having a substantially mirror surface formed of Al, Ni, Cr, Mo, Cu, or Ti. The emissivity is generally influenced by surface state, Therefore, if surface roughness is large even though the layer is formed of Al Ni, Cr, Mo, Cu, or Ti, there will be a possibility that the emissivity of the obtained layer is not lower than the emissivity of the resin film 2. Therefore, by forming the surface of the low-emissivity layer 5 to be a substantially mirror surface it is possible to effectively exert the effects of the present invention. The surface roughness of the layer can vary depending on the method for forming the low-emissivity layer 5 or the like. By employing a sputtering method for its formation it is possible to obtain a surface comparable to the minor surface.

When vapor depositing the organic material 9 on the substrate 8, the organic material 9 inevitably adheres to the low-emissivity layer 5 and deposits thereon. However, if the thickness of the organic material 9 deposited is up to 1 μm, it imparts no substantial influence on the emissivity of the low-emissivity layer 5. The thickness of an organic material deposited by only one vapor deposition is approximately several nm to several tens nm. In addition, in the case of repeating the vapor deposition of an organic material by using the same deposition mask 1, cleaning of the deposition mask 1 is usually performed at a certain period. Therefore, no substantial problem arises due to a change in emissivity of the deposition mask 1 caused by the vapor deposition material 9 deposited on the deposition mask. Organic solvents such as cyclohexanone, N-methylpyrrolidone (NMP), ethanol, isopropyl alcohol, acetone, monoethanolamine, dimethylsulfoxide and the like, are generally used for cleaning the deposition mask 1. Therefore, the low-emissivity layer 5 is also required to have washability (solvent resistance) and durability. From the viewpoint of the foregoing, and in consideration of material costs and easiness of layer formation, it is preferable that the low-emissivity layer 5 is formed of Al, Ni or Ti among the above-mentioned materials.

From the viewpoint of sufficiently exhibiting reflection effect, the thickness of the low-emissivity layer 5 is preferably 0.3 μm or more, more preferably 0.5 μm or more. Further, from the viewpoint of suppressing the entire thickness of the deposition mask 1, it is preferably 3 μm or less, more preferably 2 μm or less.

The high-emissivity layer 6 is not limited specifically as long as it has an emissivity higher than the emissivity of the surface of the resin film 2 provided with the low-emissivity layer 5, which is to be brought into contact with the substrate for vapor deposition 8. In general, the emissivity of the resin film 2 is approximately 0.8 or more and 0.95 or less, as mentioned above. By forming the above-mentioned low-emissivity layer 5 on a surface of the resin film 2 on the side facing the vapor deposition source 7 it is possible to lower the emissivity of the surface to be brought into contact with the substrate for vapor deposition 8. Although its value varies depending on the material of the low-emissivity layer 5 or the presence of the above-mentioned metal support layer 3, for example, in the case of vapor depositing a metal material such as aluminum on a polyimide film of 5 μm, the emissivity of a polyimide surface is approximately 0.42 at the temperature not lower than 22° C. and not higher than 60° C. in the wavelength region not less than 8,700 nm and not greater than 9,800 nm. Therefore, the emissivity of the high-emissivity layer 6 at the temperature not lower than 22° C. and not higher than 60° C. in the wavelength region not less than 8,700 nm and not greater than 9,800 nm is preferably 0.5 or more, more preferably 0.7 or more. From this viewpoint, the high-emissivity layer 6 is preferably formed of $Al_2O_3$, AlTiN, $CrO_2$, $Cr_2O_3$, $MoO_2$, $MoO_3$, SiC, or graphite and is a layer having a surface roughness not less than 0.1 μm and not greater than 3.0 μm in root-mean-square height. Since the emissivity is greatly influenced by surface state, if surface roughness is small even though the layer is formed of $Al_2O_3$, AlTiN, $CrO_2$, $Cr_2O_3$, $MoO_2$, $MoO_3$, SiC, or graphite, there will be a possibility that the emissivity of the obtained layer is not higher than the emissivity of the resin film 2. Therefore, it is preferable to constitute its surface by a layer whose surface roughness is 0.1 μm or more, more preferably 0.3 μm or more, in root-mean-square height. Further, in consideration of film thickness, it is preferable that the surface of the high-emissivity layer 6 be constituted by a layer having a surface roughness of 3.0 μm or less, more preferably 1.0 μm or less, in root-mean-square height. The surface roughness of the layer can vary depending on the method for forming the high-emissivity layer 6. The high-emissivity layer 6 formed by a cold spray method or the like tends to have a rough surface. Further, it can be useful to perform a surface roughening treatment by argon-based sputter etching or ion milling after completing the layer formation.

From the viewpoint of sufficiently exhibiting radiation effect, the thickness of the high-emissivity layer 6 is preferably 0.3 μm or more, more preferably 0.5 μm or more.

From the viewpoint of suppressing the entire thickness of the deposition mask 1, it is preferably 3.0 µm or less, more preferably 2.0 µm or less.

The following table 1 shows materials usable for the low-emissivity layer 5 or the high-emissivity layer 6 according to the present invention, together with approximate values of their emissivities at the temperature not lower than 22° C. and not higher than 60° C. in the wavelength region not less than 8,700 nm and not greater than 9,800 nm.

TABLE 1

Emissivities of samples

| Sample | Emissivity |
| --- | --- |
| Al | 0.025 |
| Ni | 0.04 |
| Cr | 0.07 |
| Mo | 0.07 |
| Cu | 0.1 |
| Ti | 0.15 |
| $Al_2O_3$ | 0.6 |
| AlTiN | 0.7 |
| Chromium oxide ($CrO_2$, $Cr_2O_3$) | 0.85 |
| Molybdenum oxide ($MoO_2$, $MoO_3$) | 0.8 |
| SiC | 0.9 |
| Graphite | 0.8 |

As mentioned above, the provision of the adhesion layer intends to improve the adhesion between the resin film 2 and the low-emissivity layer 5 or the high-emissivity layer 6, and prevent peeling-off of the low-emissivity layer 5 or the high-emissivity layer 6, thereby improving the durability. By providing the adhesion layer it is possible to easily smoothen the surface of a layer to be provided thereon. Therefore, it is more preferable to provide the adhesion layer between the low-emissivity layer 5 and the resin film 2. On the other hand, in the case of providing the adhesion layer between the high-emissivity layer 6 and the resin film 2, it is preferable to roughen the surface of the adhesion layer by argon-based sputter etching or ion milling before forming the high-emissivity layer 6, so as to provide irregularities. Employing the sputtering method or the like for forming the adhesion layer is, in particular, advantageous to improve the adhesion to the resin film 2. Especially, from the viewpoint of heat radiation, bringing the high-emissivity layer 6 into close contact with the resin film 2 is preferable to facilitate transmission of the heat from the resin film 2 to the high-emissivity layer 6.

The material of the adhesion layer includes Ti, Cr, Mo or the like, and Ti is preferable because of excellence in adhesion.

Since the opening 4 is exaggeratedly illustrated as having a taper shape in FIG. 1 and the following figures, the size of the opening 4 (diameter on the side facing the substrate for vapor deposition 8) is relatively small. However, the actual diameter of the opening 4 is comparable to the distance between adjacent openings 4. The reason why the opening 4 is formed in taper shape is that since the vapor deposition material 9 is emitted from the vapor deposition source 7 as a fan-shaped vapor deposition beam having, in a cross-sectional shape, a predetermined angle determined by the shape of a crucible of the vapor deposition source 7, it is required to enable vapor deposition particles in the side-end region of the beam to reach a desired place on the substrate for vapor deposition 8 without being blocked. In any of the illustrated examples, the opening 4 of the resin film 2 is formed to have two stepped portions to ensure the effect of avoiding the above-mentioned blocking. The formation of these two stepped portions can be realized by performing laser emission for opening the resin film 2 with two types of laser masks alternately replaceable as laser masks and having different opening sizes. Further, the taper shape can be obtained by differentiating the transmittance of a laser beam between a central region and a peripheral region of the opening of the laser mask. If necessary, the metal support layer 3 can be configured to have a tapered opening from the similar reason.

Next, a method for manufacturing the deposition mask 1 according to the present invention will be described with reference to FIGS. 1 and 4. The flow chart illustrated in FIG. 4 starts mainly from the step stretching and fixing the resin film 2 to a support frame (not shown), because any process that precedes step S1, including a method for manufacturing the resin film 2 and a method for manufacturing a laminate comprising the metal support layer 3 with openings and the resin film 2 in the case of manufacturing a so-called hybrid deposition mask 1 provided with the metal support layer 3, can be carried out by using various conventionally known methods. The method for manufacturing the deposition mask 1 according to the present invention is not limited specifically as long as it can form the low-emissivity layer 5 after stretching and fixing the resin film 2 constituting the deposition mask 1 to the support frame. The reason why the formation of the low-emissivity layer 5 is carried out after stretching and fixing the resin film 2 to the support frame is to prevent the low-emissivity layer 5 from being cracked when stretched.

Figure 4:
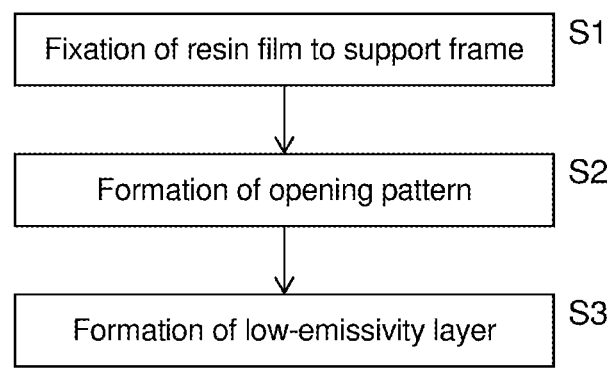
FIG. 4 is a flow chart illustrating a method for manufacturing a deposition mask according to the present invention.

First, in step S1 of FIG. 4, the resin film 2 is stretched and fixed to the support frame. In this case, the metal support layer 3 may be provided beforehand on the resin film 2 to be fixed. The stretching of the resin film 2 intends to eliminate any slack of the resin film 2, because the slack makes the size of the formed opening 4 inaccurate and the vapor deposition process possibly ends with less accuracy. The support frame (frame body) is required to have a sufficient rigidity capable of withstanding, for example, a tension applied and a metal plate whose thickness is 5 mm or more and 50 mm or less can be used. In the case of providing the metal support layer 3, the support frame is fixed in a stretched state to the metal support layer 3 by laser welding or the like. In the case of omitting the metal support layer 3, the support frame can be adhered directly to the resin film 2 with an adhesive or the like. In this case, an adhesive generating no gas during the vapor deposition can be used. For example, it is preferable to use as the adhesive, a completely curable adhesive such as an epoxy resin adhesive. If the support frame is a metal plate with magnetism, the support frame is easily fixed to the substrate for vapor deposition 8 using magnet even though the metal support layer 3 is not present. A conventionally known method is employable for stretching the resin film 2.

Next, in step S2 of FIG. 4, a pattern of the opening 4 is formed in the resin film 2. The opening to the resin film can be performed by an ordinary method in the field of manufacturing the deposition mask. For example, the resin film 2 fixed to the support frame is fixed to a working stage, and the resin film is irradiated with a laser beam to form the opening 4 by using a laser mask manufactured for the patterning of the opening 4. In this case, as mentioned above, the opening 4 of the resin film 2 can be formed to have two stepped portions. In addition, the opening 4 can be formed into a taper shape.

Next, in step S3 of FIG. 4, the deposition mask 1 according to the present invention can be obtained by forming the low-emissivity layer 5. The formation of the low-emissivity layer 5 preferably follows after the provision of the opening 4 in the resin film 2. This is because if the opening 4 is previously formed, the low-emissivity layer 5 can be formed on a side surface (inclined surface) 4a of the taper-shaped opening 4 of the resin film 2 and on a surface 4b of the stepped portion facing the vapor deposition source even when the opening 4 having a stepped portion is present in the resin film 2 as illustrated in FIG. 1. However, since the low-emissivity layer 5 is a very thin layer, the laser beam can be used to form an opening in the resin film 2. Therefore, step S2 and step S3 may be reversely performed.

Further, in the case of forming the high-emissivity layer 6 as illustrated in FIG. 2, the timing of its formation is not limited specifically. For example, even when the formation of the high-emissivity layer 6 precedes the provision of the opening of the resin film 2, if the thickness of the high-emissivity layer 6 is appropriate, it is possible to simultaneously provide the opening 4 by patterning the high-emissivity layer 6 together with the resin film 2. In this case, it is possible to form the resin film 2 by applying a liquid resin material on a foil or a film serving as the high-emissivity layer 6. In addition, the high-emissivity layer 6 can be formed after the formation of the opening in the resin film 2 and before the formation of the low-emissivity layer 5, or can be formed after the formation of the opening in the resin film 2 and after the formation of the low-emissivity layer 5. In consideration of the influence of cracks or the like due to fixing to the support frame, similar to the low-emissivity layer 5, it is preferable to form the high-emissivity layer 6 after stretching and fixing the resin film 2 constituting the deposition mask 1 to the support frame. In consideration of patterning accuracy of the opening 4 to be formed in the resin film 2, it is preferable to form the high-emissivity layer 6 after providing the opening in the resin film 2. Further, in consideration of influence on the low-emissivity layer 5, it is preferable to form the high-emissivity layer 6 before forming the low-emissivity layer 5.

The method for forming the low-emissivity layer 5 is not limited specifically and any method is employable as long as it can obtain a smooth surface state, such as a substantially mirror surface. For example, a method employable in this case can be selected from sputtering method, vacuum deposition method, ion plating method, CVD method, gloss plating method, and coating method. From the viewpoint of adhesion, selecting the sputtering method or the ion plating method is more preferable. Further, as mentioned above, the process of stretching and fixing the resin film 2 to the support frame preferably precedes the formation of the low-emissivity layer 5. This intends to prevent the low-emissivity layer 5 from being cracked when stretched. In addition, as mentioned above, in forming the low-emissivity layer 5, it is preferable to provide the adhesion layer intervening between the resin film 2 and the low-emissivity layer 5. The adhesion layer can improve the adhesion between the resin film 2 and the low-emissivity layer 5 and prevent the peeling-off of the low-emissivity layer 5, thereby improving the durability. The method for forming the adhesion layer is not limited specifically. The sputtering method, the vacuum deposition method, the ion plating method, or the like can be employed.

The method for forming the high-emissivity layer 6 includes, but not limited specifically, sputtering method, vacuum deposition method, CVD method, cold spray method, plating method, and coating method. From the viewpoint of adhesion, the sputtering method is preferable. From the viewpoint of surface roughness, the cold spray method is preferable. To satisfy both requirements, as mentioned above, it is preferable to form an adhesion layer (not shown) by the sputtering method and subsequently form the high-emissivity layer 6 by the cold spray method. Regarding the surface roughness, a desired surface roughness can be realized by the surface roughening treatment of the resin film 2 or the adhesion layer by argon-based sputter etching or ion milling before forming the high-emissivity layer 6. Further, the surface roughening treatment to be performed by the argon-based sputter etching or ion milling may follow after the layer formation by the sputtering method. The surface treatment by the sputter etching or the like is useful in that the adhesion between the resin film 2 and the high-emissivity layer 6 can be improved.

Further, the above-mentioned description of the deposition mask according to the present invention shall be similarly applied to the method for manufacturing the deposition mask according to the present invention, as long as there is no contradiction. Also, the description of the method for manufacturing the deposition mask according to the present invention shall be similarly applied to the above-mentioned deposition mask according to the present invention.

Next, a method for manufacturing an organic EL display apparatus by using the deposition mask 1 according to the present invention will be described. The manufacturing method other than the deposition mask 1 can be carried out by a conventionally known method. Therefore, a method for depositing an organic layer using the deposition mask 1 is mainly described with reference to FIGS. 5A and 5B.

The method for manufacturing an organic EL display apparatus according to the present invention includes positioning and overlapping the deposition mask 1 manufactured by the above-mentioned method on an apparatus substrate 11 having TFTs (not shown), a flattening layer, and a first electrode (e.g., anode) 12 formed on a support substrate (not shown); forming an organic deposition layer 14 by vapor depositing the organic material 9; and forming a second electrode 15 (cathode) on the deposition layer 14. It is described in more detailed by specific examples.

Figure 5A:
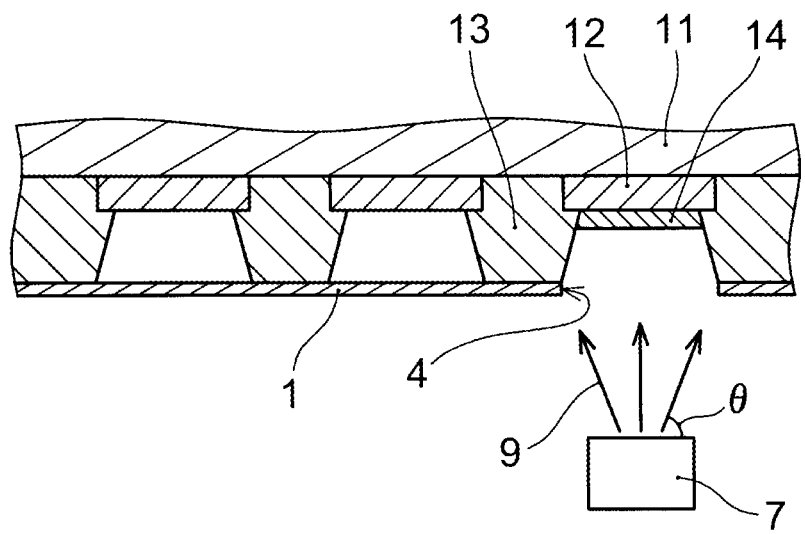
FIG. 5A is an explanatory view at the time of vapor deposition in the case of manufacturing an organic EL display apparatus according to the present invention.
Figure 5B:
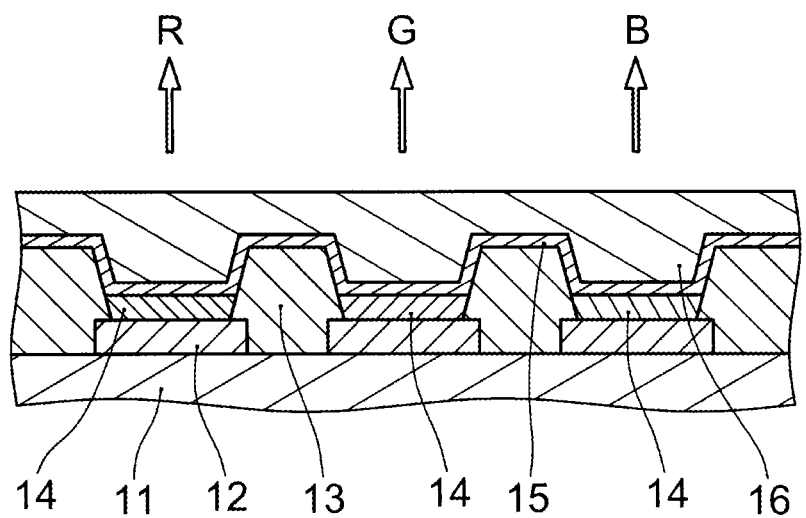
FIG. 5B is an explanatory view of a cross section illustrating a manufacturing process of an embodiment of a method for manufacturing the organic EL display apparatus according to the present invention.

Although not illustrated in the drawing, for example, the apparatus substrate 11 includes switching elements such as TFT formed on a support substrate such as a glass plate or the like for respective RGB sub pixels of each pixel. The first electrode 12 connected to the switching elements are formed as a combination film of a metal film (Al or APC) and an ITO film on the flattening layer. As illustrated in FIGS. 5A and 5B, an insulating bank 13 made of $SiO_2$, plastic or the like for separating between the adjacent sub pixels is formed. The above-mentioned deposition mask 1 is positioned and fixed on the insulating bank 13 of the apparatus substrate 11. The fixing in this case can be realized, for example, by attraction using a magnet or the like provided on the opposite side of the apparatus substrate.

In this state, as illustrated in FIG. 5A, the organic material 9 is emitted from the vapor deposition material source (crucible) 7 within a vapor deposition apparatus, the organic material 9 is vapor deposited only at a portion corresponding to the opening of the deposition mask 1, and the organic deposition layer 14 is formed on the first electrode 12 of a desired sub pixel. As mentioned above, since the opening 4 of the deposition mask 1 is formed to be smaller than the spacing of the surface of the insulating bank 13, the organic material 9 is likely to be less deposited on a sidewall of the insulating bank 13. As a result, as illustrated in FIGS. 5A and 5B, the organic deposition layer 14 is deposited substantially only on the first electrode 12. This vapor deposition process is performed for each sub pixel by sequentially changing the deposition mask. In some cases, the deposition mask may be used for vapor depositing the same material simultaneously for a plurality of sub pixels.

Although the organic deposition layer 14 is simply illustrated as a single layer in FIGS. 5A and 5B, the organic deposition layer 14 actually formed has a multilayered structure constituted by a plurality of layers made of different materials. For example, as a layer in contact with an anode 12, a hole injection layer made of a material excellent in consistency of ionization energy for improving hole injection property may be provided. A hole transport layer, which is made of, for example, amine-based material and capable of improving the stability in transporting holes and serving as an energy barrier confining electrons in the light-emitting layer, is formed on the hole injection layer. In addition, a light-emitting layer to be selected according to the light-emission wavelength is formed on this layer, for example, by doping red or green organic fluorescent material into $Alq_3$ for the red or green wavelength. As a material for blue color, a DSA-based organic material is usable. In addition, an electron transport layer made of $Alq_3$ or the like, which is capable of improving electron injection property and stably transporting electrons, is formed on the light-emitting layer. Successively depositing these layers each having a thickness of approximately several tens nm can form the organic deposition layer 14. Optionally, an electron injection layer made of LiF, Liq or the like, which is capable of improving electron injection property, may be provided between the organic layer and the metal electrode.

On the organic deposition layer 14, an organic layer of the material corresponding to each of RGB colors is deposited to constitute a light-emitting layer. When emphasis is placed on light-emitting performance, it is preferable to separately deposit a material suitable for the light-emitting layer to constitute a hole transport layer and an electron transport layer. However, in consideration of material costs, the same material may be deposited commonly for two or three of RGB colors in some cases. In the case of depositing the common material for sub pixels of two colors or more, a deposition mask having the openings corresponding to the common sub pixels is used. In the case where vapor deposition layers of respective sub pixels are different from each other, for example, it is feasible to use one deposition mask 1 for the R sub pixel and continuously deposit respective organic layers. In the case of depositing the organic layer common to RGB, it is feasible to deposit the organic layer of each sub pixel beneath the common layer and then deposit the organic layer common to all pixels at a time by using the deposition mask having openings common to RGB.

Upon completing the formation of all of the organic deposition layer 14 and the electron injection layer, such as LiF layer, the deposition mask 1 is removed and the second electrode (e.g., cathode) 15 is formed on the entire surface. The example illustrated in FIG. 5B is a top emission type configured to emit light from the upper side. Therefore, the second electrode 15 is formed of a translucent material, for example, a thin Mg—Ag eutectic layer. In addition, Al or the like can be used. In the case of a bottom emission type configured to emit light from the apparatus substrate 11 side, the first electrode 12 can be made of ITO, $In_3O_4$ or the like and the second electrode can be made of a metal whose work function is small, such as Mg, K, Li, Al or the like. A protective layer 16 made of, for example, $Si_3N_4$ or the like is formed on the surface of the second electrode 15. Although not illustrated, a sealing layer made of glass or a resin film is provided to seal the whole so as to prevent the organic deposition layer 14 from absorbing moisture. Further, another employable structure includes the organic layer as common as possible and color filters provided on its surface.

The deposition mask 1 can be repetitively used. Although the organic material 9 is deposited on the surface of the deposition mask 1 facing the vapor deposition source 7, there is no substantial influence on the emissivity of the low-emissivity layer 5 when the thickness of the deposited organic material 9 is 3 μm or less. Further, in the case of using the same deposition mask 1 to repetitively perform vapor deposition of the organic material 9, in order to prevent the accumulated layer from falling off the mask and becoming particles, it is preferable to perform cleaning at the timing when the thickness of the accumulative deposited layer is approximately 1.0 μm or more and 3.0 μm or less.

The cleaning of the deposition mask 1 can be performed by an ordinary method, for example by using an organic solvent, as mentioned above.

REFERENCE SIGNS LIST

1 Deposition mask
2 Resin film
3 Metal support layer
4 Opening
4a Side surface of opening 4
4b Surface of stepped portion of opening 4 facing vapor deposition source
5 Low-emissivity layer
6 High-emissivity layer
7 Vapor deposition source
8 Substrate for vapor deposition
9 Organic material
11 Apparatus substrate
12 First electrode
13 Bank
14 Organic deposition layer
15 Second electrode
16 Protective layer

The invention claimed is:

1. A deposition mask including a resin film having an opening pattern for film forming a thin layer pattern by vapor deposition on a substrate for vapor deposition, wherein
a low-emissivity layer whose emissivity is lower than the emissivity of said resin film is formed on at least a part of a surface of said resin film facing a vapor deposition source, and
a high-emissivity layer whose emissivity is lower than the emissivity of said resin film is formed on a surface of said resin film that is to be brought into contact with said substrate for vapor deposition.

2. The deposition mask according to claim 1, wherein an adhesion layer capable of improving adhesion between said resin film and said low-emissivity layer and/or said high-emissivity layer is provided between said resin film and said low-emissivity layer and/or said high-emissivity layer.

3. The deposition mask according to claim 1, wherein the emissivity of said low-emissivity layer at the temperature not lower than 22° C. and not higher than 60° C. in the wavelength region not less than 8,700 nm and not greater than 9,800 nm is 0.3 or less.

4. The deposition mask according to claim 3, wherein said low-emissivity layer is a layer formed of Al Ni, Cr, Mo, Cu or Ti and having a substantially mirror surface.

5. The deposition mask according to claim 1, wherein said high-emissivity layer is made of a material whose emissivity is 0.5 or higher when the temperature is not lower than 22° C. and not higher than 60° C. and the wavelength region is not less than 8,700 nm and not greater than 9,800 nm.

6. The deposition mask according to claim 5, wherein said high-emissivity layer is made of $Al_2O_3$, AiTiN, $CrO_2$, $Cr_2O_3$, $MoO_2$, $MoO_3$, SiC or graphite and has a surface roughness not less than 0.1 µm and not greater than 3.0 µm in root-mean-square height.

7. The deposition mask according to claim 1, wherein a metal support layer is provided on a part of a surface of said resin film on the side where said low-emissivity layer is to be provided.

8. A method for manufacturing a deposition mask including a resin film having an opening pattern and usable in vapor depositing a vapor deposition material, and having a low-emissivity layer whose emissivity is lower than the emissivity of said resin film on at least a part of a surface of said resin film on a side facing a vapor deposition source, the method comprising;
   forming said low-emissivity layer after stretching and fixing said resin film to a support frame, and
   forming a high-emissivity layer on a surface of said resin film opposite to the side facing said vapor deposition source after fixing said resin film to said support frame, and before forming said low-emissivity layer or after forming said low-emissivity layer, wherein an emissivity of said high-emissivity layer is higher than an emissivity of said surface of said resin film provided with said low-emissivity layer.

9. The method for manufacturing a deposition mask according to claim 8, wherein a metal support layer is brought into close contact with a surface of said resin film on the side where said low-emissivity layer is to he formed, before said resin film is fixed to said support frame.

10. The method for manufacturing a deposition mask according to claim 8, further comprising:
    forming an adhesion layer capable of improving adhesion between said resin film and said low-emissivity layer and/or said high-emissivity layer by at least one method selected from sputtering method and ion plating method, before forming said low-emissivity layer and/or said high-emissivity layer.

11. The method for manufacturing a deposition mask according to claim 8, wherein the formation of said low-emissivity layer is performed by at least one method selected from spattering method, vacuum deposition method, ion plating method, CVD method, gloss plating method, and coating method.

12. The method for manufacturing a deposition mask according to claim 8, wherein the formation of said high-emissivity layer is performed by at least one method selected from sputtering method, vacuum deposition method, CVD method, cold spray method, plating method, and coating method.

13. A method for manufacturing an organic EL display apparatus by depositing an organic layer on an apparatus substrate, the method comprising:
    positioning and overlapping the deposition mask according to claim 1 on said apparatus substrate having at least a TFT and a first electrode formed on a support substrate;
    forming an organic deposition layer by vapor depositing an organic material on said first electrode; and
    forming a second electrode on said deposition layer.

* * * * *